(12) United States Patent
Son

(10) Patent No.: US 6,297,136 B1
(45) Date of Patent: Oct. 2, 2001

(54) METHOD FOR FABRICATING AN EMBEDDED SEMICONDUCTOR DEVICE

(75) Inventor: Jeong-Hwan Son, Daejon (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/233,170

(22) Filed: Jan. 19, 1999

(30) Foreign Application Priority Data

Jan. 19, 1998 (KR) .................................................. 98-1391

(51) Int. Cl.[7] .................... H01L 21/3205; H01L 21/4763
(52) U.S. Cl. ........................ 438/592; 438/200; 438/233; 438/405; 438/595; 438/682; 438/683
(58) Field of Search .................................. 438/592, 649, 438/682, 683, 200, 233, 595, 405

(56) References Cited

U.S. PATENT DOCUMENTS

| | | | |
|---|---|---|---|
| 5,468,665 | * 11/1995 | Lee et al. | 437/44 |
| 5,656,519 | * 8/1997 | Mogami | 438/303 |
| 5,686,331 | * 11/1997 | Song | 437/41 |
| 5,792,684 | * 8/1998 | Lee et al. | 438/328 |
| 6,153,476 | * 11/2000 | Inaba et al. | 438/275 |

OTHER PUBLICATIONS

S. Shimizu, T. et al, 1997 Symposium on VLSI Technology, pp. 107–108.
Hisayo Sasaki Momose et al, International Electron Devices Meeting (IDEM), 1996, pp. 105–108.

* cited by examiner

Primary Examiner—Matthew Smith
Assistant Examiner—Craig P. Lytle

(57) ABSTRACT

A method for fabricating an embedded semiconductor device in which a logic device and a memory device are integrated into one semiconductor substrate is disclosed, which includes the steps of forming a device isolation region and active region on a semiconductor substrate having a first region and a second region, forming a gate insulation film on a predetermined portion of an upper surface of the active region of the first region and second region, forming a first conductive film pattern and a protection film pattern on the gate insulation film, forming a first side wall spacer on the lateral surfaces of the first conductive film pattern and the protection film pattern, forming source/drain by implanting a dopant into the surface of the semiconductor substrate at both sides of the first side wall spacer, forming a second side wall spacer on an outer surface of the first side wall spacer, removing the protection film pattern, and forming a second conductive film pattern on the upper surfaces of the first conductive film pattern of the first and second regions and the source/drain of the second region, so that it is possible to decrease the number of fabrication processes for thereby enhancing the productivity.

7 Claims, 5 Drawing Sheets

METHOD FOR FABRICATING AN EMBEDDED SEMICONDUCTOR DEVICE

BACKGROUND OF THE INVENTION

1. Field of the Invention

The present invention relates to an embedded semiconductor device and a system and method for fabricating an embedded semiconductor device, and in particular to a system and method for fabricating an embedded semiconductor device having a logic device and a memory device embedded into a single chip.

2. Description of the Background Art

Conventionally, semiconductor devices having singular functions are independently fabricated and mounted on a system board, and those devices are then connected with each other to implement a predetermined system. As the fabrication technology of the semiconductor device is advanced and a high performance of the system is required, a system-on-a-chip method and an embedded semiconductor device fabrication method have been used. In the system-on-a-chip method, a plurality of semiconductor devices that perform a single function are mounted onto one chip.

One known embedded semiconductor device fabrication method is typically used to embed a DRAM (Dynamic Random Access Memory) and a microprocessor into one chip. However, any one of several different fabrication processes may be used to fabricate the above-described embedded semiconductor devices, so that the fabrication thereof is complicated. Therefore, it is important to simplify the fabrication processes for fabricating various functional devices.

A known semiconductor device into which a DRAM cell and a logic device are embedded, and a fabrication method thereof will now be explained with reference to the accompanying drawings.

In FIG. 1, relative to the broken-line, the DRAM cell is illustrated in the left portion, and the logic devices are illustrated in the right portion. The left portion in the drawing is called a first region "a" and the right portion in the drawing illustrating the logic device is called a second region "b".

A plurality of device isolation regions 2 and a plurality of active regions 3 are formed in the semiconductor substrate 1 of the first region "a" and the second region "b". A gate insulation film 4 is formed on the active regions 3 of the first region "a" and the second region "b". In addition, a gate electrode 5 formed of a first conductive film pattern 5a and a second conductive film pattern 5b is formed on the gate insulation film 4. The first conductive film pattern 5a is formed of a polysilicon layer, and the second conductive film pattern 5b is formed of a metallic layer or a silicide layer. A side wall spacer 7 formed of an insulation film is formed on a lateral surface of the gate electrode 5, and source and drain electrodes 8a and 8b are formed on the surface of the semiconductor substrate and at both sides of the side wall spacer 7. In the drawings, reference numeral 8a denotes a source/drain formed in the first region, and 8b denotes a source/drain formed in the second region. The above-described construction is a common structure of the devices formed in the first region "a" and the second region "b".

Additional features of the devices formed in the second region "b" will now be explained in greater detail. A third conductive film pattern 10 is formed on the surface of the source/drain 8b. The third conductive film pattern 10 is a metallic layer or a silicide layer. Namely, in the logic device, the silicide layer 10 is formed on the surface of the source/drain 8b for decreasing the resistance of the source/drain 8b and reducing the occupying area of the chips. However, in the case of the DRAM cell mounted in the first region "a", when the silicide layer is formed on the surface of the source/drain 8a, since a junction current leakage problem may occur, the silicide layer is not formed thereon.

The known fabrication method for a semiconductor device, as shown in FIG. 1, will now be explained with reference to FIGS. 2A–2C. In the process of FIG. 2A, a plurality of device isolation regions 2 are formed in the semiconductor substrate 1 using a LOCOS process or a method for filling an oxide film into a trench after forming the trench. An active region 3 is formed on a surface of the semiconductor substrate, except the portions of the substrate corresponding to device region 2, by slightly doping an impurity. A gate insulation film 4 is formed on the front surface of the semiconductor substrate. A polysilicon layer for forming a first conductive film and a silicide layer for forming a second conductive film or a metallic layer are deposited on the gate insulation film 4. A protection film is deposited on the metallic layer. The protection film includes a side wall spacer which will be used later and a member that has a high etching selectivity, for example, an oxide film, a nitride film, a PSG (phosphorous silicate glass, etc.). The protection film, the second conductive film, and the first conductive film are selectively etched to form the protection film pattern 6a, the second conductive film pattern 5b the first conductive film pattern 5a shown in FIG. 2A The second conductive film pattern 5b and the first conductive film pattern 5a together form a gate electrode 5. The protection film pattern 6a is used to limit the height of the gate electrode 5 when the second conductive film pattern 5b of the gate electrode 5 reacts with a silicide during the self-aligning process shown in FIG. 2B, which involves self-forming the silicide on the surface of the source/drain within the second region "b".

An insulation film is formed on the entire structure of the semiconductor substrate 1 and then is etched-back to form a side wall spacer 7 on a lateral surfaces of the gate electrode 5. A predetermined dopant is implanted into the surface of the semiconductor substrate 1 using the protection film pattern 6a and the side wall spacer 7 as a mask, thereby forming the source/drain electrodes 8a and 8b.

As shown in FIG. 2B, a mask pattern 9 is formed on the entire structure of the semiconductor substrate 1 of the first region "a" using a photo resist.

Next, a metallic layer such as titanium, nitride titanium or tungsten is formed on the resultant entire structure that has been formed on the semiconductor substrate 1 of the second region, and a silicidation reaction occurs between the metallic layer and the source/drain 8b by heat-treating the resultant structure. In the source/drain 8b, the silicon component of the semiconductor substrate 1 and the metallic component of the metallic layer are engaged to perform the silicidation reaction. As a result, the silicidation reaction is not performed with respect the metallic layer formed on the side wall spacer 7 and the protection film pattern 6a. The portions of the metallic layer not involved in the silicidation reaction is selectively removed by a wet etching operation using $NH_3$ or $H_2O_2$. Thus, a silicide layer, hereinafter known as the third conductive film pattern 10, is formed only on the surface of the source/drain 8 of the devices mounted in the second region "b" as shown in FIG. 2b.

Thereafter, as shown in FIG. 3C, the mask pattern 9 is removed, so that the fabrication of the known embedded semiconductor device is finished.

In the known semiconductor device fabrication process, even though the second conductive film pattern and the third conductive film pattern are made of the same material, a step for forming the third conductive film pattern on the surface of the source/drain is additionally performed after forming the second conductive film pattern as an upper layer of the gate electrode. Therefore, the fabrication process is complicated, decreasing productivity.

In addition, when using the metallic film rather than a silicide film as the upper layer 5b of the gate electrode, there must be a height limit imposed upon the gate electrode. Due to this height limitation, the height of the polysilicon layer forming the lower layer of the gate electrode is effectively decreased. When the height of the polysilicon layer becomes lower than 1000 A, it is difficult to perform a polysilicon layer doping operation for adjusting the threshold voltage Vth. Namely, in the known art, after the polysilicon layer is doped, the dopant of the polysilicon may penetrate into the gate insulation film formed below the gate electrode or the surface of the semiconductor substrate during the heat treatment process, so that the characteristic of the semiconductor device may be decreased.

SUMMARY OF THE INVENTION

It is an object of the present invention to provide an embedded semiconductor device, and a system and method for fabricating an embedded semiconductor device which overcomes the above and other problems encountered in the background art.

It is another object of the present invention to provide an embedded semiconductor device that can be easily fabricated, and a system and method for fabricating an embedded semiconductor device which is capable of simplifying the fabrication process of a semiconductor device, e.g., by concurrently performing a step for forming an upper layer of a gate electrode (i.e., a second conductive film pattern) and a step for forming a third conductive film pattern (a metallic layer or a silicide layer) on an upper surface of a source/drain of a logic device.

It is another object of the present invention to provide an embedded semiconductor device having enhanced characteristics, and a system and method for fabricating an embedded semiconductor device which is capable of enhancing characteristics of the semiconductor device, e.g., by preventing the thickness of a polysilicon layer which is a lower layer of a gate electrode from becoming below 1000 A.

Other and further objects, features and advantages of the present invention will be set forth in the description that follows, and in part will become apparent from the detailed description, or may be learned by practice of the invention.

To achieve the above and other objects, there is provided a system and method for fabricating an embedded semiconductor device which includes the steps of forming a plurality of device isolation regions and a plurality of active regions on a semiconductor substrate which is divided into a first region for manufacturing a semiconductor device having a predetermined function and a second region for fabricating a semiconductor device having another predetermined function, forming a gate insulation film, a first conductive film pattern, and a protection film pattern on a predetermined portion in the active regions of the first and second regions, forming a first side wall spacer on the lateral surfaces of the first conductive film pattern and the protection film pattern of the first and second regions, forming a source/drain near the surface of the semiconductor substrate at both sides of the first side wall spacer of the first region and forming a source/drain near the surface of the semiconductor substrate at both sides of the first side wall spacer of the second region, covering the source/drain formed in the first region using an insulation film, removing the protection film pattern, and forming a second conductive film pattern on the upper surface of the first conductive film pattern of the first and second regions and the upper surface of the source/drain formed in the second region.

In addition, there is provided an embedded semiconductor device fabricated using the above-described system and method.

Additional advantages, objects and features of the invention will become more apparent from the description which follows.

BRIEF DESCRIPTION OF THE DRAWINGS

The present invention will become more fully understood from the detailed description given hereinbelow and the accompanying drawings, which are given by way of illustration only and thus are not limitative of the present invention, and wherein.

DETAILED DESCRIPTION OF THE PREFERRED EMBODIMENTS

Figure 1:
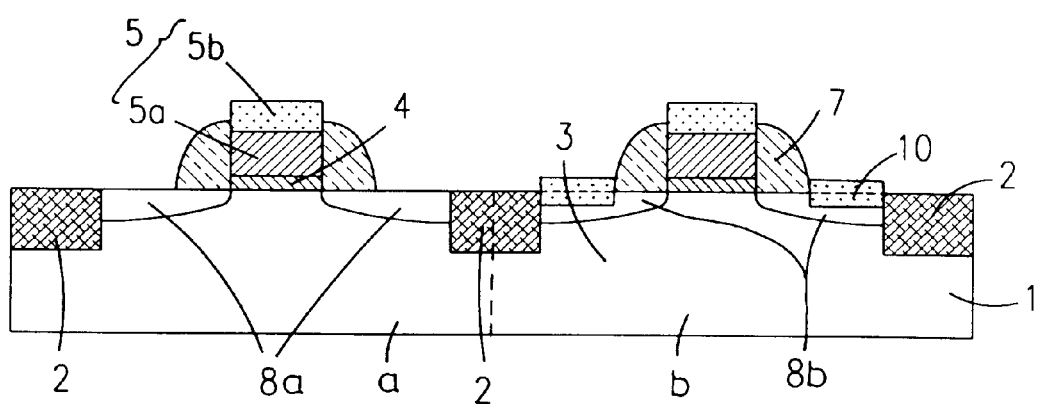
FIG. 1 is a cross-sectional view illustrating a known semiconductor device.
Figure 2A:
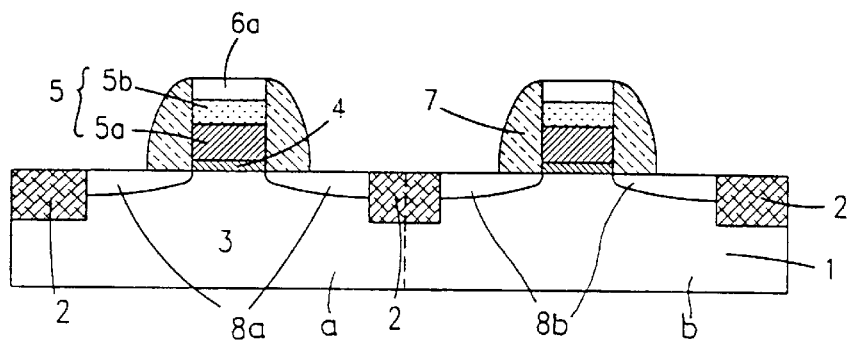
FIGS. 2A through 2C are cross-sectional view illustrating a known method for fabricating a semiconductor device.
Figure 2B:
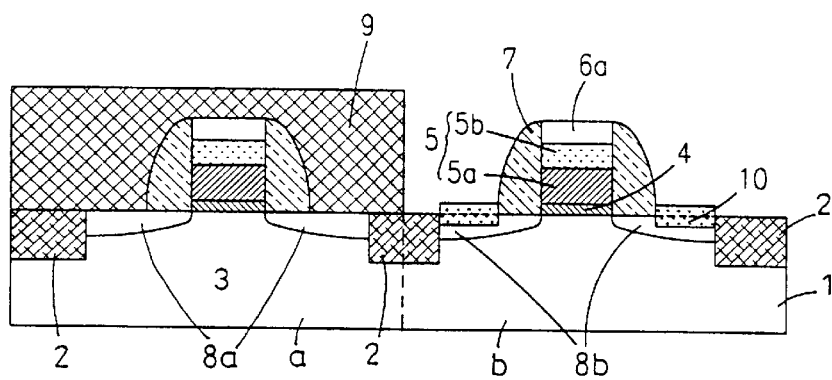
Figure 2C:
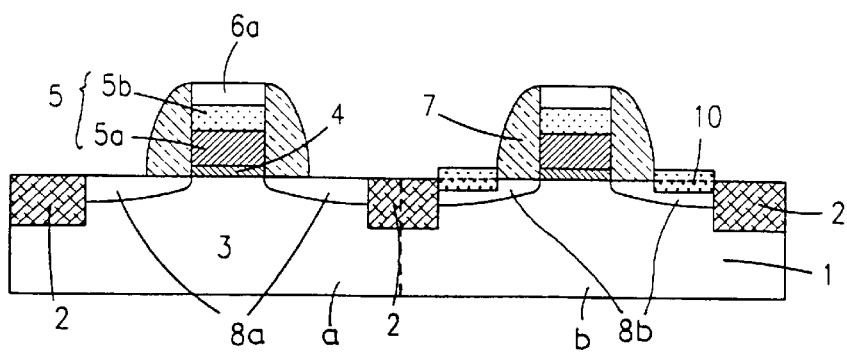
Figure 3:
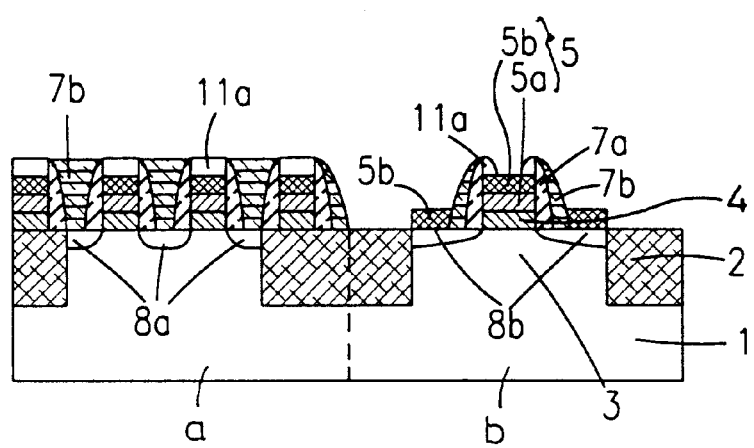
FIG. 3 is a cross-sectional view illustrating an embedded semiconductor device according to the present invention.

FIG. 3 is a cross-sectional view illustrating the construction of an embedded semiconductor device according to the present invention.

As shown therein, a plurality of device isolation regions 2 and a plurality of active regions 3 are formed on a semiconductor substrate 1 having a first region "a" for forming a DRAM cell or a memory cell therein and a second region "b" for forming logic devices therein. A gate insulation film 4 is formed in the active region 3, and first conductive film pattern 5a and second conductive film pattern 5b are formed on the gate insulation film 4. The stacked structure of the first conductive film pattern 5a and the second conductive film pattern 5b together form gate electrode 5. Source/drain electrodes 8a and 8b are formed on the surface of the semiconductor substrate and at both sides of the gate electrode 5. The source/drain 8a is a source/drain forming the memory cell mounted in the first region, and the source/drain 8b is a source/drain forming the logic devices mounted in the second region. The insulation film pattern 11a is formed on the gate electrodes, and a first side wall spacer 7a formed of an insulation film is formed on a lateral surface of a multilayer pattern formed of the gate insulation film 4, gate electrode 5 and insulation film pattern 11a. The second side wall spacer 7b is formed on an outer surface of the first side wall spacer 7a. In addition, the second conductive film pattern 5b, namely, the metallic layer or the silicide layer, is formed on the upper surface of the source/drain 8b of the second region.

The gate electrodes formed in the first and second regions is formed in multilayer structre of a polysilicon layer and a metallic layer. Alternatively, the gate electrodes formed in the first and second regions is formed of a polysilicon layer and silicide layer. An embedded semiconductor device having a metallic layer or a silicide layer is formed on the upper surface of the source/drain 8b formed in the second region b.

FIGS. 4A–4H are cross-sectional views of an embedded semiconductor device during the stages of its fabrication according to the present invention.

Figure 4A:
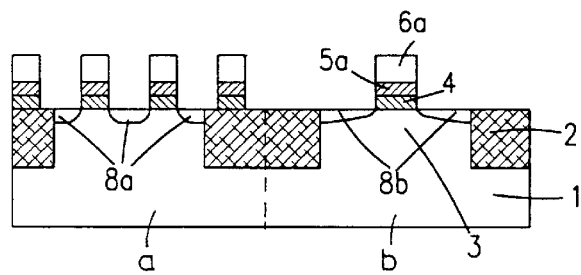
FIGS. 4A through 4H are cross-sectional views illustrating a method for fabricating the embedded semiconductor device of the present invention.

FIG. 4A is a cross-sectional view illustrating an embedded semiconductor device during a first fabrication stage according to the present invention. As shown therein, the device isolation region 2 is formed by a LOCOS method on the semiconductor substrate 1 having the first region "a" in which a memory cell or a DRAM cell is mounted and a second region "b" in which logic devices are mounted.

A dopant is slightly implanted on the surface of the semiconductor substrate, except in the portions of the substrate corresponding to device isolation region 2, thereby forming an active region 3. The gate insulation film, the first conductive film, and the protection film are formed on the front surface of the semiconductor substrate 1 and then patterned and etched, thereby forming the gate insulation film 4, the first conductive film pattern 5a and the protection film pattern 6a on the semiconductor substrate 1 of the active region 3. The gate insulation film 4 is formed of a silicon oxide film, and the first conductive film pattern 5a is formed of a polysilicon layer, and the protection film pattern 6a is formed of an oxide film, a nitride film, a PSG film, etc. In particular, the polysilicon layer is a polysilicon layer that is doped by an in-situ method or a polysilicon layer that is formed by ion-implanting a dopant into the polysilicon layer which is deposited in a non-doped state.

A predetermined dopant is implanted into the semiconductor substrate 1 at both sides of the first conductive film pattern 5a, thereby forming a diffusion layer or the source/drain electrodes 8a and 8b. In the drawings, reference numeral 8a denotes the source/drain formed in the first region, and reference numeral 8b denotes the source/drain formed in the second region. The source/drain 8a is operated identically with the source/drain 8b.

Figure 4B:
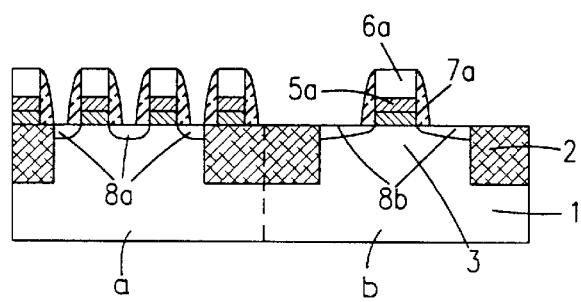

As shown in FIG. 4B, the first insulation film is formed on the entire structure shown in FIG. 4A and then is etched back, so that the first side wall spacer 7a is formed on the lateral surfaces of the first conductive film pattern 5a and the protection film pattern 6a.

Figure 4C:
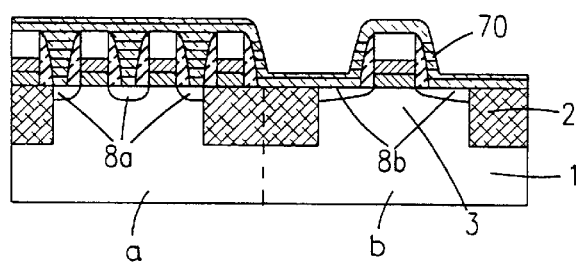

FIG. 4C is a cross-sectional view illustrating the semiconductor device after the second insulation film 70 is formed on the entire structure shown in FIG. 4B.

Figure 4D:
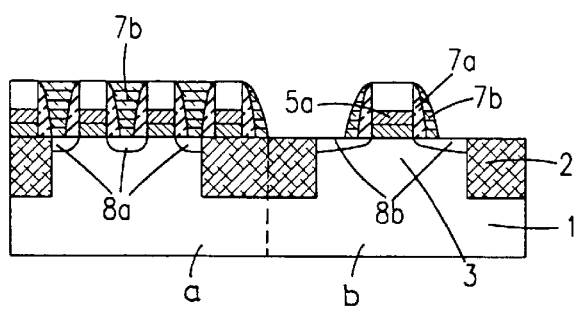

FIG. 4D is a cross-sectional view illustrating the semiconductor device after the second insulation film 70 is etched back. A second side wall spacer 7b is formed on an outer surface of the first side wall spacer 7a by the above etching-back process. At this time, the distances between the devices mounted in the first region are short, the material of the second insulation film is filled between the first side wall spacers 7a of the neighboring devices after the second insulation film is etched back, so that the source/drain 8a is fully covered by the second insulation film. Since the distance between the devices mounted in the second region is longer than the distances between the devices mounted in the first region, the second side wall spacer 7b is formed on an outer surface of the first side wall spacer 7a after the second insulation film is etched back, and a part of the upper surface of the source/drain 8b is exposed.

Figure 4E:
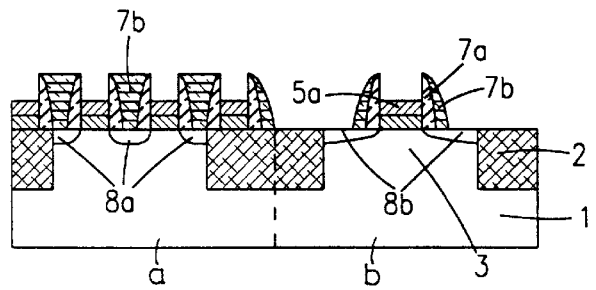

FIG. 4E is a cross-sectional view illustrating the construction after the protection film pattern 6a formed on the upper surface of the first conductive film pattern 5a is selectively removed.

Figure 4F:
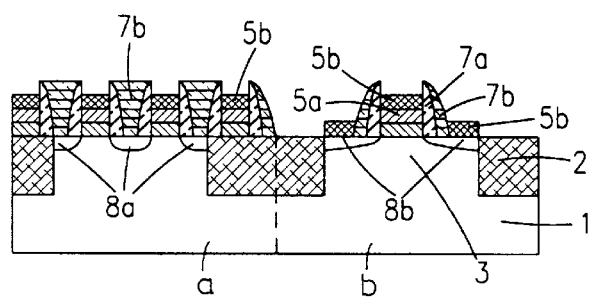

FIG. 4F is a cross-sectional view illustrating the semiconductor device after the second conductive film pattern 5b formed of a metallic layer or a silicide layer is selectively formed on the upper surfaces of the first conductive film pattern 5a including the silicon member and the source/drain 8b of the second region device. The first conductive film pattern 5a and the second conductive film pattern 5b formed on the first conductive film pattern 5a are operated as a gate electrode 5. As a result, the metallic layer or silicide layer is formed on the upper layer of the gate electrode 5 of the devices formed in the first region and the second region, and the metallic layer or the silicide layer is formed on the upper surface of the source/drain 8b of the devices mounted in the second region. The formation method of the metallic layer or the silicide layer, namely, the second conductive film pattern 5b, will now be explained.

A metallic layer made of a tungsten, titanium, or cobalt is formed on the entire structure shown in FIG. 4E. Thereafter, the semiconductor substrate is heat-treated so that a silicidation reaction occurs on the member containing a silicon component like the first conductive film pattern 5a and the source/drain 8b. As a result, a silicide layer such as a tungsten silicide, titanium silicide or cobalt silicide is formed on the upper surfaces of the first conductive film pattern 5a and the source/drain 8 in the second region. The tungsten, titanium or cobalt metallic layer which are not silyated and which remain on the upper surfaces of the insulation films such as the second side wall spacer 7b, are removed by a wet etching method using $NH_3$ or $H_2O_2$.

Alternatively, a metallic layer such as a tungsten, titanium or cobalt or a silicide layer such as a tungsten silicide, titanium silicide or cobalt silicide may be formed on the entire structure shown in FIG. 4E. The resultant structure is selectively etched so that the metallic layer or silicide layer remains only on the upper surface of the first conductive film pattern 5a in the first and second regions and on the upper surface of the source/drain 8 in the second region using the mask pattern.

Figure 4G:
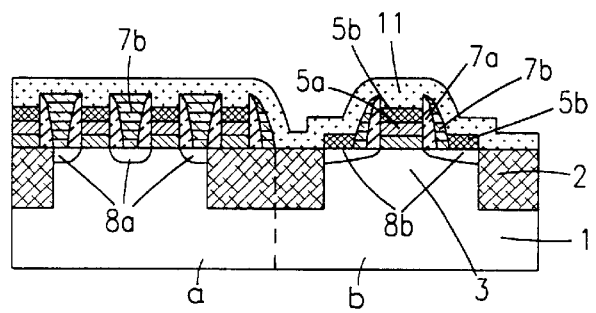

FIG. 4G is a cross-sectional view illustrating an embedded semiconductor device after the third insulation film 11 is formed on the entire structure shown in FIG. 4F.

Figure 4H:
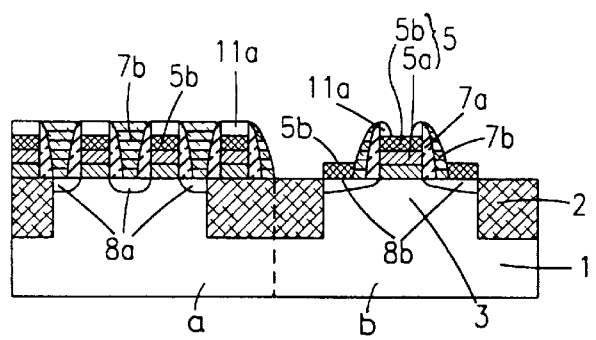

FIG. 4H is a cross-sectional view illustrating an embedded semiconductor device after the third insulation film 11 is etched back, and the protection pattern 11a is formed for protecting the gate electrode 5 of the first and second region devices.

As described above, in the embedded semiconductor device and fabrication method thereof according to the present invention, it is possible to concurrently form a silicide layer or a metallic layer on the upper surfaces of the gate electrodes of the memory cell and the logic portion and on the upper surface of the source/drain of the logic portion. Therefore, the fabrication process of the embedded semiconductor device is implemented more easily, and the productivity is increased.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method for fabricating an embedded semiconductor device, comprising the steps of:

forming a plurality of device isolation regions and a plurality of active regions on a semiconductor substrate which is divided into a first region for manufacturing a semiconductor device having a predetermined function and a second region for fabricating a semiconductor device having a another predetermined function;

forming a gate insulation film, a first conductive film pattern, and a protection film pattern on a predetermined portion in the active regions of the first and second regions;

forming a first side wall spacer on the side surfaces of the first conductive film pattern and the protection film pattern of the first and second regions;

forming a source/drain near the surface of the semiconductor substrate at both sides of the first side wall spacer of the first region and forming a source/drain near the surface of the semiconductor substrate at both sides of the first side wall spacer of the second region;

after forming the first side wall spacer, forming an insulation film over the semiconductor substrate;

etching back the insulation film so as to leave the insulation film on the source/drain of the first region, form a second sidewall spacer laterally outward of the first sidewall spacer of the second region, and expose the protection film;

removing the exposed protection film pattern; and forming a second conductive film pattern on the upper surface of the first conductive film pattern of the first and second regions and the upper surface of the source/drain formed in the second region.

2. The method of claim 1, wherein said step for forming the second conductive film pattern on the upper surface of the first conductive film pattern of the first and second regions and the upper surface of the source/drain formed in the second region includes:

forming a metallic layer on a structure of the semiconductor substrate resulting after the protection film pattern is removed;

performing a self-aligned silicidation operation with respect to the metallic layer; and removing the metallic layer which is not silyated using a wet etching method using $NH_3$ or $H_2O_2$.

3. The method of claim 2, wherein said silicidation step of the metallic layer is a step for heat-treating the semiconductor substrate.

4. The method of claim 1, wherein said step for forming the second conductive film pattern on the upper surface of the first conductive film pattern of the first and second regions and the upper surface of the source/drain formed in the second region includes:

forming a metallic layer on the entire structure of the semiconductor substrate resulting after the protection film pattern is removed;

forming a mask pattern on the metallic layer so that only the upper surfaces of the first conductive film pattern of the first and second regions and the source/drain of the second region are exposed; and selectively etching and removing exposed portions of the metallic layer.

5. The method of claim 1, wherein said first conductive film pattern is a doped polysilicon layer.

6. The method of claim 1, wherein said second conductive film pattern is formed of one selected from the group comprising a tungsten, titanium, and cobalt.

7. The method of claim 1, wherein said second conductive film pattern is a silicide layer which is formed of one selected from the group comprising a tungsten silicide, titanium silicide, and cobalt silicide.

* * * * *